US010654181B2

(12) United States Patent
Yoshimura et al.

(10) Patent No.: US 10,654,181 B2
(45) Date of Patent: May 19, 2020

(54) SURFACE-COATED CUTTING TOOL AND METHOD OF MANUFACTURING THE SAME

(71) Applicant: SUMITOMO ELECTRIC HARDMETAL CORP., Itami-shi (JP)

(72) Inventors: Kouhei Yoshimura, Sorachi-gun (JP); Shinya Imamura, Sorachi-gun (JP); Hideaki Kanaoka, Sorachi-gun (JP); Anongsack Paseuth, Sorachi-gun (JP); Satoshi Ono, Sorachi-gun (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 169 days.

(21) Appl. No.: 15/740,927

(22) PCT Filed: Apr. 25, 2017

(86) PCT No.: PCT/JP2017/016405
§ 371 (c)(1),
(2) Date: Dec. 29, 2017

(87) PCT Pub. No.: WO2018/037625
PCT Pub. Date: Mar. 1, 2018

(65) Prior Publication Data
US 2018/0339415 A1 Nov. 29, 2018

(30) Foreign Application Priority Data

Aug. 24, 2016 (JP) .................. 2016-163628

(51) Int. Cl.
B32B 9/00 (2006.01)
B26B 9/00 (2006.01)
(Continued)

(52) U.S. Cl.
CPC ............... B26B 9/00 (2013.01); B32B 15/04 (2013.01); C23C 16/029 (2013.01);
(Continued)

(58) Field of Classification Search
None
See application file for complete search history.

(56) References Cited

U.S. PATENT DOCUMENTS 5,985,427 A * 11/1999 Ueda ..................... C23C 16/403
428/216
9,863,064 B2 * 1/2018 Kanaoka ............... B23B 27/148
(Continued)

FOREIGN PATENT DOCUMENTS

EP 2570510 A1 3/2013
JP 2013-111722 A 6/2013
(Continued)

OTHER PUBLICATIONS

Namiesnik, Trace Analysis—Challenges and Problems, 2002, Critical Reviews in Analytical Chemistry, 32(4), 271-300. (Year: 2002).*

Primary Examiner — Seth Dumbris
Assistant Examiner — Kim S. Horger
(74) Attorney, Agent, or Firm — Baker Botts L.L.P.; Michael A. Sartori

(57) ABSTRACT

A surface-coated cutting tool includes a base material and a coating formed on the base material. The coating includes an $\alpha\text{-}Al_2O_3$ layer. The $\alpha\text{-}Al_2O_3$ layer contains a plurality of $\alpha\text{-}Al_2O_3$ crystal grains and chlorine, and has a TC(006) of more than 5 in texture coefficient TC(hkl). The $\alpha\text{-}Al_2O_3$ layer includes lower and upper layers, the lower layer is located closer to the base material than the upper layer is, and the upper layer is located opposite to the base material across the lower layer, in a thickness direction of the $\alpha\text{-}Al_2O_3$ layer. The lower layer has a thickness of 1.0 μm. The upper layer has a thickness of 0.5 μm or more. The chlorine in the lower layer has a concentration distribution in which an atomic concentration $C_{Cl}$ of the chlorine
(Continued)

decreases in a direction away from the base material, in a thickness direction of the lower layer.

8 Claims, 1 Drawing Sheet

(51) Int. Cl.
*B32B 15/04* (2006.01)
*C23C 16/40* (2006.01)
*C23C 16/02* (2006.01)
*C23C 16/455* (2006.01)
*C23C 16/34* (2006.01)
*C23C 16/36* (2006.01)

(52) U.S. Cl.
CPC .......... *C23C 16/0272* (2013.01); *C23C 16/34* (2013.01); *C23C 16/36* (2013.01); *C23C 16/403* (2013.01); *C23C 16/45523* (2013.01)

(56) References Cited

U.S. PATENT DOCUMENTS

| | | | | |
|---|---|---|---|---|
| 2007/0104945 | A1* | 5/2007 | Ruppi | C23C 16/36 428/337 |
| 2017/0029944 | A1* | 2/2017 | Kubo | C23C 16/36 |
| 2017/0209936 | A1* | 7/2017 | Kanaoka | C23C 16/029 |

FOREIGN PATENT DOCUMENTS

| | | | | |
|---|---|---|---|---|
| JP | 2015-009358 A | | 1/2015 | |
| WO | WO-2015099047 A1 | * | 7/2015 | ............. C23C 16/36 |
| WO | WO-2015114049 A1 | * | 8/2015 | ............ C23C 16/403 |
| WO | WO-2017037798 A1 | * | 3/2017 | ............ C23C 16/029 |

* cited by examiner

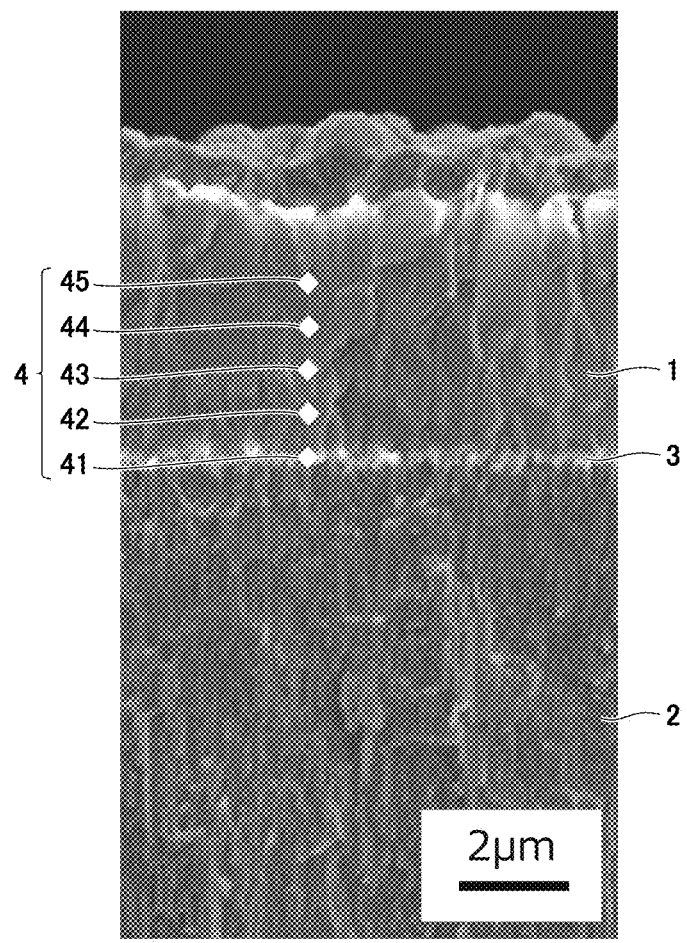

SURFACE-COATED CUTTING TOOL AND METHOD OF MANUFACTURING THE SAME

TECHNICAL FIELD

The present invention relates to a surface-coated cutting tool and a method of manufacturing the same. The present application claims priority to Japanese Patent Application No. 2016-163628 filed on Aug. 24, 2016, the disclosure of which is hereby incorporated by reference in its entirety.

BACKGROUND ART

A surface-coated cutting tool having a coating formed on a base material has conventionally been used. Recently, various techniques have been proposed in an attempt to enhance the performance of the surface-coated cutting tool, such as a technique for improving the quality of the coating by changing the crystallographic texture of $Al_2O_3$. For example, Japanese Patent Laying-Open No. 2015-009358 (Patent Document 1) proposes a surface-coated cutting tool with its wear resistance, particularly crater wear resistance improved by controlling the texture of an $\alpha$-$Al_2O_3$ layer included in a coating on a base material, so that TC(0012) is more than 5 in texture coefficient TC(hkl) and the width at half maximum of a rocking curve peak is 30° or less.

European Patent Application Publication No. 2570510 (Patent Document 2) proposes a cutting tool with its wear resistance improved by including, on a base material of cemented carbide, an $\alpha$-$Al_2O_3$ layer having the (0012) texture and containing 100 ppm or more of sulfur. Japanese Patent Laying-Open No. 2013-111722 (Patent Document 3) proposes a surface-coated cutting tool including an $\alpha$-$Al_2O_3$ layer having the (0001) orientation, a layer included in the $\alpha$-$Al_2O_3$ layer and located adjacent to a base material with a layer interposed therebetween has a lower crystallographic texture, to thereby increase the adhesive force between the $\alpha$-$Al_2O_3$ layer and the layer interposed between the $\alpha$-$Al_2O_3$ layer and the base material.

CITATION LIST

Patent Document

PTD 1: Japanese Patent Laying-Open No. 2015-009358
PTD 2: European Patent Publication No. 2570510
PTD 3: Japanese Patent Laying-Open No. 2013-111722

SUMMARY OF INVENTION

A surface-coated cutting tool according to an aspect of the present invention includes a base material and a coating formed on the base material. The coating includes an $\alpha$-$Al_2O_3$ layer. The $\alpha$-$Al_2O_3$ layer contains a plurality of $\alpha$-$Al_2O_3$ crystal grains and chlorine, and has a TC(006) of more than 5 in texture coefficient TC(hkl). The $\alpha$-$Al_2O_3$ layer includes a lower layer and an upper layer, the lower layer is located closer to the base material than the upper layer is, and the upper layer is located opposite to the base material across the lower layer, in a thickness direction of the $\alpha$-$Al_2O_3$ layer. The lower layer has a thickness of 1.0 µm. The upper layer has a thickness of 0.5 µm or more. The chlorine in the lower layer has a concentration distribution in which an atomic concentration of the chlorine decreases in a direction away from the base material, in a thickness direction of the lower layer.

A method of manufacturing a surface-coated cutting tool according to an aspect of the present invention includes the step of forming, on the base material by a CVD method, the coating including the $\alpha$-$Al_2O_3$ layer. In the step, a content of HCl gas contained in a raw material gas is 6 to 10 vol % at a start of formation of the $\alpha$-$Al_2O_3$ layer, and the content of HCl gas is decreased to 0.5 to 6 vol % after the start of formation.

BRIEF DESCRIPTION OF DRAWINGS

FIG. 1 shows a photomicrograph as a substitute for a diagram, measurement points in an $\alpha$-$Al_2O_3$ layer that are defined for measuring respective atomic concentrations of chlorine (Cl) and sulfur (S) by EDS being indicated on the photomicrograph.

DESCRIPTION OF EMBODIMENTS

Problems to be Solved by the Disclosure

The surface-coated cutting tool of Patent Document 1, however, has a room for improvement in terms of toughness and peeling resistance, for example. The cutting tool of Patent Document 2 is insufficient in chipping resistance. The surface-coated cutting tool of Patent Document 3 is insufficient in wear resistance, due to the lower texture of the layer adjacent to the base material.

The present invention has been made in view of the above-described circumstances, and an object of the present invention is to provide a surface-coated cutting tool that can achieve an extended life by its high wear resistance and prevention of coating fracture such as peeling and chipping, and to provide a method of manufacturing the surface-coated cutting tool.

Advantageous Effects of the Disclosure

As seen from the foregoing, provided is a surface-coated cutting tool that can achieve an extended life by its high wear resistance and prevention of coating fracture such as peeling and chipping.

Description of Embodiment of the Invention

The inventors of the present invention have thoroughly conducted studies for solving the above-described problems, and finally reached the present invention. In a process of nucleation and crystal growth of an $\alpha$-$Al_2O_3$ layer, the content of HCl contained in a raw material gas was controlled to generate a chlorine concentration distribution in the thickness direction of the $\alpha$-$Al_2O_3$ layer. Specifically, in the chlorine concentration distribution, the chlorine concentration decreased in the direction away from the base material, in the thickness direction of the $\alpha$-$Al_2O_3$ layer. It has been found that a surface-coated cutting tool having high wear resistance and enabling prevention of coating fracture such as peeling and chipping is thus achieved.

First of all, the present invention will be described based on features listed below.

[1] A surface-coated cutting tool according to an aspect of the present invention includes a base material and a coating formed on the base material. The coating includes an $\alpha$-$Al_2O_3$ layer. The $\alpha$-$Al_2O_3$ layer contains a plurality of $\alpha$-$Al_2O_3$ crystal grains and chlorine, and has a TC(006) of more than 5 in texture coefficient TC(hkl). The $\alpha$-$Al_2O_3$ layer includes a lower layer and an upper layer, the lower layer is located closer to the base material than the upper layer is, and the upper layer is located opposite to the base material across the lower layer, in a thickness direction of the $\alpha$-$Al_2O_3$ layer. The lower layer has a thickness of 1.0 μm. The upper layer has a thickness of 0.5 μm or more. The chlorine in the lower layer has a concentration distribution in which an atomic concentration of the chlorine decreases in a direction away from the base material, in a thickness direction of the lower layer. The surface-coated cutting tool having the above-described features has high wear resistance and enables prevention of coating fracture such as peeling and chipping to thereby achieve an extended life.

[2] Preferably, the chlorine in the lower layer has a maximum atomic concentration of less than 0.3 at. %. Accordingly, the surface-coated cutting tool can be improved in fracture resistance, particularly peeling resistance and chipping resistance.

[3] Preferably, the chlorine in the upper layer has a maximum atomic concentration of less than 0.05 at. %. Accordingly, the surface-coated cutting tool can be improved in wear resistance.

[4] Preferably, the surface-coated cutting tool satisfies a relation: $C_{CIMAX-1} \geq 2C_{CIMAX-2}$, where $C_{CIMAX-1}$ represents a maximum atomic concentration of the chlorine in the lower layer and $C_{CIMAX-2}$ represents a maximum atomic concentration of the chlorine in the upper layer. Accordingly, the effects of achieving high wear resistance and preventing coating fracture such as peeling and chipping can be accomplished more advantageously.

[5] Preferably, the TC(006) is more than 6. Accordingly, the wear resistance of the surface-coated cutting tool can be enhanced more effectively.

[6] Preferably, the lower layer contains sulfur, and the lower layer has a $C_{CIS}$ distribution in which $C_{CIS}$ decreases in the direction away from the base material, in the thickness direction of the lower layer, where $C_{CIS}$ represents a numerical value determined by adding together an atomic concentration of the chlorine at a predetermined measurement point in the lower layer and an atomic concentration of the sulfur at the predetermined measurement point. Accordingly, improvement of the fracture resistance, particularly improvement of the peeling resistance and chipping resistance can be accomplished more advantageously.

[7] Preferably, the lower layer contains sulfur, and the lower layer has a $C_{Cl/S}$ distribution in which $C_{Cl/S}$ decreases in the direction away from the base material, in the thickness direction of the lower layer, where $C_{Cl/S}$ represents a numerical value determined by dividing an atomic concentration of the chlorine at a predetermined measurement point in the lower layer by an atomic concentration of the sulfur at the predetermined measurement point. Accordingly, improvement of the fracture resistance, particularly improvement of the peeling resistance and chipping resistance can be accomplished more advantageously.

[8] A method of manufacturing a surface-coated cutting tool according to an aspect of the present invention includes the step of forming, on the base material by a CVD method, the coating including the $\alpha$-$Al_2O_3$ layer. In the step, a content of HCl gas contained in a raw material gas is 6 to 10 vol % at a start of formation of the $\alpha$-$Al_2O_3$ layer, and the content of HCl gas is decreased to 0.5 to 6 vol % after the start of formation. The above-described features enable a surface-coated cutting tool to be manufactured that has high wear resistance and enables prevention of coating fracture such as peeling and chipping to thereby achieve an extended life.

DETAILS OF EMBODIMENT OF THE INVENTION

In the following, an embodiment of the present invention (hereinafter also referred to as "present embodiment") will be described in further detail. The expression "A to B" as used herein is intended to define an upper limit and a lower limit of a range (i.e., not less than A and not more than B), and even if "A" is followed by no unit symbol and only "B" is followed by a unit symbol, "A" and "B" should be construed as being followed by the same unit symbol.

A compound or the like expressed herein by a chemical formula includes the compound with any of all conventionally known atomic ratios if the atomic ratio is not particularly limited, and the compound is not necessarily limited to the compound with a stoichiometric ratio. For example, in the case of an expression "TiAlN," the ratio of the number of atoms between the elements constituting TiAlN is not limited to Ti:Al:N=0.5:0.5:1, and includes all conventionally known ratios of the number of atoms. This is applied as well to any expressions of compounds other than "TiAlN." Moreover, in the present embodiment, the metal element such as titanium (Ti), aluminum (Al), silicon (Si), tantalum (Ta), or chromium (Cr) and the non-metal element such as nitrogen (N), oxygen (O), or carbon (C) may not necessarily constitute a stoichiometric composition.

<<Surface-Coated Cutting Tool>>

A surface-coated cutting tool of the present embodiment includes a base material and a coating formed on the base material. The coating preferably covers the entire surface of the base material. However, even the cutting tool in which a part of the base material is not covered with this coating or the structure and makeup of the coating is partially different does not go beyond the scope of the present invention.

The surface-coated cutting tool can suitably be used as a cutting tool such as drill, end mill, indexable insert for the drill, indexable insert for the end mill, indexable insert for milling, indexable insert for turning, metal-slitting saw, gear-cutting tool, reamer, tap, or the like.

<Base Material>

As the base material, any base material conventionally known as a base material of this type may be used. For example, the base material is preferably any of a cemented carbide (including, for example, a WC-based cemented carbide, a cemented carbide containing WC and Co, and a cemented carbide containing WC and Co and additionally a carbonitride of Ti, Ta, Nb or the like), a cermet (having a main component such as TiC, TiN, TiCN or the like), a high-speed steel, a ceramic material (such as titanium carbide, silicon carbide, silicon nitride, aluminum nitride, aluminum oxide, or the like), cubic boron nitride sintered body, and a diamond sintered body.

Among these variety of base materials, the cemented carbide (particularly WC-based cemented carbide), or the cermet (particularly TiCN-based cermet) is preferably selected. These base materials are excellent in balance between hardness and strength at high temperature, and have excellent characteristics for the base material of the surface-coated cutting tool for the above-described use. When WC-based cemented carbide is used for the base material, its structure may include free carbon and/or a deficient layer called η phase or ε phase.

The surface of the base material may be modified. For example, the base material of cemented carbide may have a surface in which a β-free layer is formed, and the base material of cermet may have a surface-hardened layer. Even when the surface of the base material is modified, the desired effects are still exhibited.

In the case where the surface-coated cutting tool is an indexable insert or the like, the base material may have or may not have a chip breaker. The shape of the edge ridgeline may be any shape such as a sharp edge (the ridge where the rake face and the flank face meet each other), a honed edge (a sharp edge processed to be rounded), a negative land (beveled), and a combination of the honed edge and the negative land.

<Coating>

The coating includes an $\alpha$-$Al_2O_3$ layer. For example, the coating may be made up of a plurality of layers including at least one $\alpha$-$Al_2O_3$ layer and further including other layers.

Examples of the aforementioned other layers may be TiCNO layer, TiBN layer, TiC layer, TiN layer, TiAlN layer, TiSiN layer, AlCrN layer, TiAlSiN layer, TiAlNO layer, AlCrSiCN layer, TiCN layer, TiSiC layer, CrSiN layer, AlTiSiCO layer, TiSiCN layer, and the like.

Preferably, the coating has a thickness of 5 to 30 μm. More preferably, the coating has a thickness of 10 to 25 μm. If the thickness is less than 5 μm, there is a possibility that the wear resistance is insufficient. If the thickness is more than 30 μm, there is a possibility that the coating is peeled off or broken highly frequently when a large stress is applied between the coating and the base material during intermittent processing.

<$\alpha$-$Al_2O_3$ Layer>

The $\alpha$-$Al_2O_3$ layer contains a plurality of $\alpha$-$Al_2O_3$ (aluminum oxide having an $\alpha$-type crystal structure) crystal grains and chlorine (Cl). The $\alpha$-$Al_2O_3$ layer includes polycrystalline $\alpha$-$Al_2O_3$ containing a plurality of $\alpha$-$Al_2O_3$ crystal grains. The crystal grains usually have a grain size on the order of 0.1 to 2 μm.

The $\alpha$-$Al_2O_3$ layer has the (006) orientation. "Having the (006) orientation" is herein intended to mean that a reflection plane having a highest value of the texture coefficient TC(hkl) is the (006) plane, among (hkl) reflection planes (eight reflection planes referred to later herein in connection with the present embodiment) that have respective TC(hkl) values in XRD data for the $\alpha$-$Al_2O_3$ layer derived from an analysis by means of an x-ray diffractometer described later herein. In particular, the $\alpha$-$Al_2O_3$ layer has a TC(006) of more than 5 in texture coefficient TC(hkl) expressed by the following expression (1).

$$TC(hkl) = \frac{I(hkl)}{I_0(hkl)} \left\{ \frac{1}{n} \Sigma_1^n \frac{I(hkl)}{I_0(hkl)} \right\}^{-1} \quad (1)$$

In the expression (1), I(hkl) represents an x-ray diffraction intensity of a (hkl) reflection plane, and $I_0$(hkl) represents a standard intensity according to PDF card No. 00-042-1468 of the ICDD. In the expression (1), n represents the number of reflections used for the calculation and is eight in the present embodiment. (hkl) planes used for reflection are (012), (104), (110), (006), (113), (024), (116), and (300).

ICDD (registered trademark) is an abbreviation for International Center of Diffraction Data. PDF (registered trademark) is an abbreviation for Power Diffraction File.

TC(006) of the $\alpha$-$Al_2O_3$ layer in the present embodiment can be expressed by the following expression (2).

$$TC(006) = \frac{I(006)}{I_0(006)} \left\{ \frac{1}{8} \Sigma_1^8 \frac{I(hkl)}{I_0(hkl)} \right\}^{-1} \quad (2)$$

"TC(006) of more than 5 in texture coefficient TC(hkl)" means that a numerical value given by the above expression (2) which is determined by substituting TC(006) in the expression (1) is more than 5. The $\alpha$-$Al_2O_3$ layer having a TC(006) of more than 5 has effective hardness and Young's modulus against impact and vibration under severe cutting conditions, and therefore can contribute to improvement of the wear resistance.

The TC(006) is preferably more than 6. A greater TC(006) enables more effective improvement of the wear resistance. While the upper limit of TC(006) is not limited, the upper limit is 8 or less since the number of reflection planes used for the calculation is 8.

This TC(hkl) can be measured through analysis by means of an x-ray diffractometer. TC(hkl) can for example be measured by means of an x-ray diffractometer (product name: "SmartLab (registered trademark)") manufactured by Rigaku Corporation, scanning speed: 21.7°/min, step: 0.01°, scanning range: 15 to) 140° under the following conditions. It should be noted that the result of measurement of the TC(hkl) by means of the x-ray diffractometer is herein referred to as "XRD result."

characteristic x-ray: Cu-K$\alpha$
tube voltage: 45 kV
tube current: 200 mA
filter: multilayer mirror
optical system: focusing method
x-ray diffraction method: $\theta$-$2\theta$ method
range irradiated with x-ray: A pinhole collimator was used to irradiate a range having a diameter of 0.3 μm with x-ray.

<Thickness of $\alpha$-$Al_2O_3$ Layer>

The $\alpha$-$Al_2O_3$ layer preferably has a thickness of 2 to 15 μm. Accordingly, both the wear resistance and the fracture resistance can be achieved. If the thickness of the $\alpha$-$Al_2O_3$ layer is less than 2 μm, there is a possibility that wear is likely to increase. If the average thickness is more than 15 μm, there is a possibility that the fracture resistance is deteriorated.

Upper Layer and Lower Layer

The $\alpha$-$Al_2O_3$ layer also includes a lower layer and an upper layer. The lower layer is located closer to the base material than the upper layer is, and the upper layer is located opposite to the base material across the lower layer. The lower layer has a thickness of 1.0 μm. The lower layer is defined for measuring the Cl concentration distribution as described later herein, and the lower layer is a region extending 1 μm in the direction from the base material to the upper layer. The upper layer has a thickness of 0.5 μm or more. The upper limit of the thickness of the upper layer is 14

The upper layer has a thickness of 0.5 μm or more. In the $\alpha$-$Al_2O_3$ layer, therefore, the region located opposite to the base material across the lower layer and having an extremely low Cl concentration as described later herein has a sufficient thickness to prevent Cl from adversely affecting the wear resistance imparted by $\alpha$-$Al_2O_3$ crystal grains. If the thickness of the upper layer is more than 14 μm, however, the total thickness of the coating including the $\alpha$-$Al_2O_3$ layer is accordingly larger, resulting in a possibility that peeling or breakage of the coating occurs highly frequently when a large stress is applied between the coating and the base material during intermittent processing.

In the present embodiment, each of the thickness of the coating, the thickness of the $\alpha$-$Al_2O_3$ layer and the thickness of the upper layer in the $\alpha$-$Al_2O_3$ layer means an average thickness. These thicknesses can be measured in the following way with a field emission scanning electron microscope (FE-SEM).

First, the base material covered with the coating is cut along a plane parallel with the normal to the rake face of the base material so as to expose a cross section. Next, the exposed cross section is polished to produce a polished surface to be observed. The thickness of the coating is determined as follows. Any five locations (five fields of view) each including the coating that appears on the polished surface are observed at a magnification of ×5000 to determine the thickness of the coating. Finally, the average of respective thicknesses in the five fields of view is determined, from which the average thickness of the coating may be determined. Respective thicknesses of the $\alpha\text{-}Al_2O_3$ layer and the upper layer in the $\alpha\text{-}Al_2O_3$ layer are determined as follows. Any five locations (five fields of view) each including the $\alpha\text{-}Al_2O_3$ layer as well as the upper layer in the $\alpha\text{-}Al_2O_3$ layer that appear on the polished surface are observed at a magnification of ×5000 to determine respective thicknesses. Finally, the average of respective thicknesses in the five fields of view is determined, from which the average thickness of the $\alpha\text{-}Al_2O_3$ layer and the average thickness of the upper layer in the $\alpha\text{-}Al_2O_3$ layer may be determined. In the $\alpha\text{-}Al_2O_3$ layer, the lower layer is a region extending 1 μm in the direction from the base material to the upper layer. The thickness of the upper layer is therefore calculated by determining the thickness of the remaining region, namely the $\alpha\text{-}Al_2O_3$ layer excluding the lower layer.

For polishing of the cross section of the base material covered with the coating, any conventionally known method may be used. For example, the cross section of the base material may be subjected to ion milling with argon ion, and accordingly a smoothed polished surface to be observed can be produced. The conditions of the aforementioned ion milling with Ar ion are for example as follows.

acceleration voltage: 6 kV ion beam incident angle: 0 to 5° from the normal to the rake face of the base material ion beam irradiation time: 6 hours After this, the smoothed polished surface to be observed may be analyzed with the FE-SEM.

<Concentration Distribution of Chlorine Contained in $\alpha\text{-}Al_2O_3$ Layer>

Chlorine (may be represented by symbol "Cl" of the element hereinafter) contained in the $\alpha\text{-}Al_2O_3$ layer has a concentration distribution in which the atomic concentration of chlorine decreases, in the direction away from the base material, in a thickness direction of the lower layer. This may be explained conceptually as follows, for example. In the lower layer, points A, B, and C are specified in order in the direction away from the base material in the thickness direction of the lower layer. The Cl concentration distribution then meets the relation: Cl atomic concentration at point A>Cl atomic concentration at point B>Cl atomic concentration at point C. Such a concentration distribution of Cl enables a high adhesive force between the coating and the base material, and thereby enables the tool fracture resistance to be significantly improved.

As to chlorine, "a concentration distribution in which the atomic concentration of chlorine decreases in the direction away from the base material, in a thickness direction of the lower layer" herein means that the lower layer may at least include a portion where the atomic concentration of chlorine decreases in the direction away from the base material, in the thickness direction of the lower layer. It also means that the concentration distribution of chlorine always meets the relation: Cl atomic concentration at point X>Cl atomic concentration at point Y, where point X is defined as a point abutting on the interface between the lower layer and the base material (an interface between the lower layer and a layer (such as TiCN layer, TiCNO layer) if any, adjacent to the lower layer and located between the lower layer and the base material), and point Y is defined as a point abutting on the interface between the lower layer and a layer adjacent to the lower layer and located opposite to the base material across the lower layer, and respective Cl atomic concentrations at these points are measured.

As long as the lower layer includes a portion where the atomic concentration of chlorine decreases in the direction away from the base material and the relation: Cl atomic concentration at point X>Cl atomic concentration at point Y is met, the lower layer may include a portion where the Cl atomic concentration is constant in the direction away from the base material. Moreover, it may also include a portion where the Cl atomic concentration increases in the direction away from the base material, or a portion containing no Cl, for example.

Chlorine in the lower layer has a maximum atomic concentration of preferably less than 0.3 at. %, and more preferably 0.02 to 0.2 at. %. The lower limit of the maximum atomic concentration in the lower layer is 0.01 at. %. If the maximum atomic concentration of chlorine in the lower layer is 0.3 at. % or more, there is a possibility that the adhesive force between the coating and the base material may be insufficient due to the excessively high chlorine concentration.

Chlorine in the upper layer has a maximum atomic concentration of preferably less than 0.05 at. %, and more preferably 0 to 0.04 at. %. The lower limit of the maximum atomic concentration in the upper layer is 0 at. %. If the maximum atomic concentration of chlorine in the upper layer is 0.05 at. % or more, there is a possibility that the wear resistance of the coating is deteriorated due to the excessively high chlorine concentration.

Further, in the present embodiment, preferably $C_{ClMAX-1} \geq 2 C_{ClMAX-2}$ is satisfied, where $C_{ClMAX-1}$ represents a maximum atomic concentration of chlorine in the lower layer and $C_{ClMAX-2}$ represents a maximum atomic concentration of chlorine in the upper layer. Accordingly, the advantageous effects that high wear resistance is exhibited and coating fracture such as peeling and chipping is prevented can be achieved advantageously. More preferably, the relation between $C_{ClMAX-1}$ and $C_{ClMAX-2}$ satisfies $C_{ClMAX-1} \geq 3 C_{ClMAX-2}$. The limit of the relation between $C_{ClMAX-1}$ and $C_{ClMAX-2}$ is $C_{ClMAX-1} = 10 C_{ClMAX-2}$ and $C_{ClMAX-1} < 2 C_{ClMAX-2}$. If $C_{ClMAX-1} < 2 C_{ClMAX-2}$ is met, the lower layer and the upper layer are almost equivalent to each other in terms of the chlorine concentration, and therefore, the advantageous effect that both high wear resistance and high fracture resistance are achieved tends to be inadequate. If $C_{ClMAX-1} > 10 C_{ClMAX-2}$ is met, the difference in Cl concentration between the lower layer and the upper layer is excessively large, resulting in a tendency that the fracture resistance is insufficient.

Preferably, the aforementioned $C_{ClMAX-1}$ is identified in a region extending 0.5 μm inward, in the thickness direction of the lower layer, from the interface between the lower layer and the base material or the interface between the lower layer and a layer (such as TiCN layer or TiCNO layer) adjacent to the lower layer and located between the lower layer and the base material. Preferably, $C_{ClMIN-1}$ representing a minimum atomic concentration of chlorine in the lower layer is identified in a region extending 0.5 μm inward, in the thickness direction of the lower layer, from the interface between the lower layer and a layer opposite to the base material across the lower layer. $C_{CIMAX-1}$ is preferably 0.1 to 0.3 at. %, and $C_{CIMIN-1}$ is preferably 0.01 to 0.05 at. %.

In addition, more preferably the difference between $C_{CIMAX-1}$ and $C_{CIMIN-1}$ is 0.5 at. % or more. The difference may be 2 at. % or less. If the difference between $C_{CIMAX-1}$ and $C_{CIMIN-1}$ is more than 2 at. %, there is a possibility that the fracture resistance is insufficient. The above-described Cl concentration distribution produces a high adhesive force between the coating and the base material, and thereby enables a significant improvement of the tool fracture resistance.

The atomic concentration of Cl contained in the lower layer and the upper layer of the α-Al$_2$O$_3$ layer is herein expressed in atomic percent (at. %). Specifically, the atomic concentration of Cl can be expressed by an atomic composition percentage [Cl/(all constituent elements)×100] where the denominator is the sum of respective numbers of atoms of all constituent elements contained in the α-Al$_2$O$_3$ layer, and the numerator is the number of atoms of Cl. For example, when the constituent elements contained in the α-Al$_2$O$_3$ layer are Al, O, C, Cl, Ti, and S, the atomic concentration of Cl can be expressed by an atomic composition percentage [Cl/(Al+O+C+Cl+Ti+S)×100] where the denominator is the sum of respective numbers of atoms of Al, O, C, Cl, Ti, and S, and the numerator is the number of atoms of Cl.

The atomic concentration of Cl can be measured by analyzing the polished surface to be observed that is used for measuring the average thickness for example of the α-Al$_2$O$_3$ layer as described above, by means of energy dispersive X-ray spectroscopy (EDS) mounted in an FE-SEM.

For example, the atomic concentration of Cl can be measured by means of EDS mounted in an FE-SEM (product name (model No.) "SU6600" manufactured by Hitachi High-Technologies Corporation). For measurement, the acceleration voltage of the FE-SEM is set to 15 kV. Conditions for the EDS are set so that the number of frames is 150 and selected elements are C, O, Al, S, Cl, and Ti. As shown in FIG. 1, a plurality of measurement points are defined at predetermined intervals in the thickness direction, in order from the interface (TiCNO layer 3) between an α-Al$_2$O$_3$ layer 1 and the base-side layer (TiCN layer 2), toward the top surface of the coating. At these measurement points, each of the atomic concentrations of C, O, Al, S, Cl, and Ti contained in α-Al$_2$O$_3$ layer is measured. Accordingly, the atomic concentration of Cl can be identified based on the atomic composition percentage.

FIG. 1 shows measurement points 4 superposed on a photomicrograph that are included in α-Al$_2$O$_3$ layer 1 and defined for measuring the atomic concentration of Cl and the atomic concentration of S as described later herein, by means of EDS. In FIG. 1, a TiCN layer 2 is formed on a base material (not shown), a TiCNO layer 3 is deposited on TiCN layer 2, and α-Al$_2$O$_3$ layer 1 is formed on TiCNO layer 3 to form a coating. For analysis, measurement points 4 (first measurement point 41, second measurement point 42, third measurement point 43, fourth measurement point 44, fifth measurement point 45) are set at predetermined intervals (at intervals of 0.2 μm, for example) from the point abutting on TiCNO layer 3 forming the interface between α-Al$_2$O$_3$ layer 1 and TiCN layer 2. Then, at each of first measurement point 41 to fifth measurement point 45, the atomic concentration of Cl and the atomic concentration of S are calculated. In FIG. 1, only measurement points 4 that are defined in the lower layer are shown. The aforementioned measurement points are preferably a plurality of (at least five) measurement points defined at regular intervals so that the atomic concentration of Cl and the atomic concentration of S described later herein in the lower layer from its interface with the base-side-abutting layer to the coating-surface-side abutting layer, in the thickness direction, can be measured.

The maximum atomic concentration of Cl in the lower layer can be calculated by determining the maximum value among respective Cl atomic concentrations calculated at aforementioned measurement points. The maximum atomic concentration of Cl in the upper layer can be calculated similarly to the maximum atomic concentration of Cl in the lower layer.

<Relation Between Chlorine and Sulfur Contained in Lower Layer>

In the present embodiment, preferably the lower layer contains sulfur (may be represented by symbol "S" of the element hereinafter). Preferably the lower layer has a $C_{CI/S}$ distribution in which $C_{CI/S}$ decreases in the direction away from the base material, in the thickness direction of the lower layer, where $C_{CI/S}$ represents a numerical value determined by adding together an atomic concentration of chlorine at a predetermined measurement point in the lower layer and an atomic concentration of sulfur at the predetermined measurement point.

Further, preferably the lower layer has a $C_{CI/S}$ distribution in which $C_{CI/S}$ decreases in the direction away from the base material, in the thickness direction of the lower layer, where $C_{CI/S}$ represents a numerical value determined by dividing an atomic concentration of chlorine at a predetermined measurement point in the lower layer by an atomic concentration of sulfur at the predetermined measurement point. It is supposed herein that if the atomic concentration of sulfur at a predetermined measurement point is 0 at. %, the value of $C_{CI/S}$ is 50. More preferably, in the $C_{CI/S}$ distribution, $C_{CI/S}$ monotonously decreases in the direction away from the base material without increasing at all in the lower layer. The surface-coated cutting tool in the present embodiment has the above-described relation between chlorine and sulfur in the lower layer, to thereby have high wear resistance and enable significant enhancement of the effect of preventing coating fracture such as peeling and chipping.

This may be explained conceptually as follows, for example. As to the sum $C_{CIS}$ determined by adding together the atomic concentration of chlorine at a predetermined measurement point and the atomic concentration of sulfur at the measurement point, the $C_{CIS}$ distribution meets the relation: $C_{CIS}$ at point D>$C_{CIS}$ at point E>$C_{CIS}$ at point F, where points D, E, and F are defined in order in the lower layer in the direction away from the base material, in the thickness direction of the lower layer.

"$C_{CIS}$ Distribution in which $C_{CIS}$ decreases in the direction away from the base material, in the thickness direction of the lower layer" is intended to mean that the lower layer may at least include a portion in which the value of $C_{CIS}$ decreases in the direction away from the base material, in the thickness direction of the lower layer. In the $C_{CIS}$ distribution, respective values of $C_{CIS}$ calculated at point T and point U always meet the relation: $C_{CIS}$ at point T>$C_{CIS}$ at point U, where point T is a point abutting on the interface between the lower layer and the base material (if an adjacent layer (such as TiCN layer, TiCNO layer) is adjacent to the lower layer and located between the lower layer and the base material, the interface between the lower layer and the adjacent layer), and point U is a point abutting on the interface between the lower layer and an adjacent layer adjacent to the lower layer and located opposite to the base material across the lower layer.

As long as the lower layer includes a portion in which the value of $C_{Cl/S}$ decreases in the direction away from the base material and the relation: $C_{Cl/S}$ at point T>$C_{Cl/S}$ at point U is met, the lower layer may include a portion in which $C_{Cl/S}$ is constant in the direction away from the base material. Further, the lower layer may also include a portion in which $C_{Cl/S}$ increases in the direction away from the base material.

As to the numerical value $C_{Cl/S}$ determined by dividing the atomic concentration of chlorine at a predetermined measurement point by the atomic concentration of sulfur at the measurement point, the lower layer also has a $C_{Cl/S}$ distribution meeting the relation: $C_{Cl/S}$ at point D>$C_{Cl/S}$ at point E>$C_{Cl/S}$ at point F, where points D, E, and F are those described above. Respective values of $C_{Cl/S}$ calculated at point T and point U always satisfy the relation: $C_{Cl/S}$ at point T>$C_{Cl/S}$ at point U. As long as the lower layer includes a portion in which the value of $C_{Cl/S}$ decreases in the direction away from the base material and the relation: $C_{Cl/S}$ at point T>$C_{Cl/S}$ at point U is met, the lower layer may include a portion in which $C_{Cl/S}$ is constant in the direction away from the base material. The lower layer may also include a portion in which $C_{Cl/S}$ increases in the direction away from the base material. Particularly as to the $C_{Cl/S}$ distribution, more preferably the lower layer always has a $C_{Cl/S}$ distribution in which the $C_{Cl/S}$ decreases in the direction away from the base material in the thickness direction of the lower layer. In this case, the $C_{Cl/S}$ distribution does not include a portion in which the value of $C_{Cl/S}$ is constant in the direction away from the base material and a portion in which the value of $C_{Cl/S}$ increases in the direction away from the base material.

These $C_{Cl/S}$ and $C_{Cl/S}$ are now described in terms of the sulfur concentration distribution. Sulfur contained in the lower layer may or may not have a constant atomic concentration in the direction away from the base material, in the thickness direction of the lower layer. If the sulfur atomic concentration is not constant, preferably the lower layer has a sulfur distribution in which the S atomic concentration changes similarly to the Cl concentration. For example, as the Cl atomic concentration decreases in the direction away from the base material, the S atomic concentration also decreases in the direction and, as the Cl atomic concentration increases in the direction away from the base material, the S atomic concentration also increases in the direction. In this case, preferably the amount of the increase/decrease of the sulfur atomic concentration is smaller than the amount of the increase/decrease of the Cl atomic concentration.

The atomic concentration of S contained in the lower layer is also expressed in atomic percent (at. %) similarly to the Cl atomic concentration. Therefore, the atomic concentration of S can be expressed by an atomic composition percentage [S/(all constituent elements)×100] where the denominator is the sum of respective numbers of atoms of all constituent elements contained in the α-Al$_2$O$_3$ layer, and the numerator is the number of atoms of S. For example, when the constituent elements contained in the α-Al$_2$O$_3$ layer are Al, O, C, Cl, Ti, and S, the atomic concentration of S can be expressed by an atomic composition percentage [S/(Al+O+C+Cl+Ti+S)×100].

The S atomic concentration can also be measured by the same method as the method for measuring the Cl atomic concentration. Therefore, as the S atomic concentration and the Cl atomic concentration at each of predetermined measurement points (first measurement point 41 to fifth measurement point 45 in FIG. 1, for example) are identified, the value of $C_{Cl/S}$ and the value of $C_{Cl/S}$ are accordingly determined.

<Grain Size of α-Al$_2$O$_3$ Crystal Grains in α-Al$_2$O$_3$ Layer>

In the present embodiment, the grain size of α-Al$_2$O$_3$ crystal grains in the α-Al$_2$O$_3$ layer can be measured using the above-described polished surface to be observed. Specifically, in the α-Al$_2$O$_3$ layer, a location 0.5 μm away, toward the base material, from the surface of the α-Al$_2$O$_3$ layer appearing on the polished surface is observed with an FE-SEM at a magnification of ×5000 (if an adjacent layer adjacent to the α-Al$_2$O$_3$ layer and opposite to the base material across the α-Al$_2$O$_3$ layer is included, the above-identified surface of the α-Al$_2$O$_3$ layer is the interface between the α-Al$_2$O$_3$ layer and the adjacent layer). The grain size of the α-Al$_2$O$_3$ crystal grains can be measured from a photomicrograph image of the FE-SEM by means of the section method. The section method used in the present embodiment is a method for calculating the grain size by counting the number of crystal grains across a certain width and dividing the width by the counted number of crystal grains.

Preferably, in the α-Al$_2$O$_3$ layer, the α-Al$_2$O$_3$ crystal grains having a grain size of 0.2 to 2 μm occupy 20 to 80% by area of a measurement surface which is parallel with a surface of the α-Al$_2$O$_3$ layer or parallel with an interface between the α-Al$_2$O$_3$ layer and an adjacent layer, the adjacent layer is adjacent to the α-Al$_2$O$_3$ layer and located on an opposite side to the base material, and the measurement surface is located at a depth of 0.5 μm from the surface or the interface. If the α-Al$_2$O$_3$ crystal grains occupying 20 to 80% by area of the measurement surface have a grain size of less than 0.2 μm, there is a possibility that the fracture resistance is deteriorated. If the grain size is more than 2 μm, there is a possibility that the wear resistance is deteriorated.

The upper limit of the grain size of the α-Al$_2$O$_3$ crystal grains is preferably 1.85 μm or less. The lower limit of the grain size is 0.2 μm. As long as the value of the grain size is not less than 0.2 μm, the value is a preferable value. This is for the reasons that the fracture resistance can be improved simultaneously with the wear resistance as long as the grain size falls in the range as defined above. If the ratio of α-Al$_2$O$_3$ crystal grains with a grain size of 0.2 to 2 μm is less than 20% by area or more than 80% by area of the measurement surface, it is impossible to achieve both the fracture resistance and the wear resistance. A more preferred ratio of the α-Al$_2$O$_3$ crystal grains with a grain size of 0.2 to 2 μm is 50 to 70% by area.

<Other Layers>

The coating may include layers other than the α-Al$_2$O$_3$ layer as described above. An example of the other layers is a TiCN layer for example. This TiCN layer is excellent in wear resistance and therefore can provide higher wear resistance to the coating. The TiCN layer is particularly preferably formed by the MT-CVD (medium temperature CVD) method. Among the CVD methods, the MT-CVD method can be used to form a layer at a relatively low temperature of approximately 800 to 1000° C., and can reduce damage to the base material caused by heating in the process of forming the layer. The TiCN layer may be disposed for example between the α-Al$_2$O$_3$ layer and the base material (to form an intermediate layer described later herein). The coating may also include, as the other layers, an outermost surface layer and an intermediate layer described later herein, for example.

Outermost Surface Layer

In a surface of the coating, an outermost surface layer in which any one of Ti carbide, Ti nitride, or Ti boride is a main component may be disposed. The outermost surface layer is a layer located at the outermost surface position in the coating. It should be noted, however, that the outermost surface layer may not be formed in a region including the edge ridgeline. In the case where other layers are not formed on the $\alpha$-$Al_2O_3$ layer, the outermost surface layer is disposed directly on the $\alpha$-$Al_2O_3$ layer.

"Any one of Ti carbide, Ti nitride, or Ti boride is a main component" means that the outermost surface layer contains 90 mass % or more of any one of Ti carbide, Ti nitride, and Ti boride. It preferably means that the outermost surface layer is made of any one of Ti carbide, Ti nitride, and Ti boride, besides inevitable impurities.

In the case where the outermost surface layer is formed, the outermost surface layer has an effect of assuming a clear chromatic color for example to thereby make it easy to identify a corner (identify a used part) of a cutting insert after used for cutting.

The outermost surface layer preferably has an average thickness of 0.05 to 1 µm. The upper limit of the average thickness of the outermost surface layer is preferably 0.8 µm and more preferably 0.6 µm. The lower limit of the average thickness of the outermost surface layer is preferably 0.1 µm and more preferably 0.2 µm. If the average thickness is less than 0.05 µm, there is a possibility that sufficient fracture resistance is not obtained. If the average thickness is more than 1 µm, there is a possibility that the adhesion between the outermost surface layer and a layer adjacent to the outermost surface layer is deteriorated.

Intermediate Layer

Preferably, the coating has an intermediate layer between the $\alpha$-$Al_2O_3$ layer and the base material. Examples of the intermediate layer may be TiN layer, TiCN layer, TiCNO layer, TiBN layer, and the like. The intermediate layer can be disposed for example between the $\alpha$-$Al_2O_3$ layer and the base material to increase the adhesion of the $\alpha$-$Al_2O_3$ layer in the coating. The intermediate layer can be formed by any known method.

Preferably, the average thickness of each of the TiCN layer and the TiBN layer is 2 to 20 µm. If the average thickness is less than 2 µm, there is a possibility that wear is likely to increase. If the average thickness is more than 20 µm, there is a possibility that the fracture resistance is deteriorated.

Preferably, the average thickness of the TiN layer is 0.3 to 1 µm. The thickness falling in this range enables further enhancement of the adhesion of the $\alpha$-$Al_2O_3$ layer in the coating. More preferably, the average thickness of the TiN layer is 0.4 to 0.8 µm. The thickness of the intermediate layer such as TiN layer, TiCN layer, TiCNO layer, and TiBN layer can be measured by the same method as the method used for measuring the thickness of the $\alpha$-$Al_2O_3$ layer.

As seen from the foregoing, the surface-coated cutting tool in the present embodiment can achieve an extended life by its high wear resistance and prevention of coating fracture such as peeling and chipping.

<<Method of Manufacturing Surface-Coated Cutting Tool>>

A method of manufacturing a surface-coated cutting tool in the present embodiment includes the step of forming, on the base material by a CVD method, the coating including the $\alpha$-$Al_2O_3$ layer. In this step, the content of HCl gas contained in a raw material gas is 6 to 10 vol % at a start of formation of the $\alpha$-$Al_2O_3$ layer, and the content of HCl gas is decreased to 0.5 to 6 vol % after the start of formation.

<Step of Forming the Coating>

A surface-coated cutting tool can be manufactured appropriately by forming a coating on a base material through a chemical vapor deposition (CVD) method. Since the deposition temperature of the CVD method is 800 to 1200° C. which is higher than that of the physical vapor deposition method, use of the CVD method enhances the adhesion to the base material. When coating layers other than the $\alpha$-$Al_2O_3$ layer are formed, these layers can be formed by any conventionally known method. The thickness of the $\alpha$-$Al_2O_3$ layer and the thickness of each of the other layers can be adjusted by appropriately regulating the deposition time (the deposition rate for each layer is about 0.5 to 2.0 µm/hour).

Formation of the $\alpha$-$Al_2O_3$ Layer

The $\alpha$-$Al_2O_3$ layer can be formed in the following way by means of the CVD method.

First, by a known method, a TiCN layer is formed on another layer formed on the base material or a TiCN layer is formed on the base material without another layer interposed therebetween, and a TiCNO layer is formed on a surface of the TiCN layer. Further, a surface of the TiCNO layer is oxidized to cause nucleation of $\alpha$-$Al_2O_3$ crystal grains. Subsequently, $\alpha$-$Al_2O_3$ crystal is grown to form an $\alpha$-$Al_2O_3$ layer in which a lower layer and an upper layer are formed. When the lower layer of the $\alpha$-$Al_2O_3$ layer is formed, the content of HCl gas contained in a raw material gas is 6 to 10 vol % at the start of formation of the lower layer, and the HCl gas content is thereafter decreased to 0.5 to 6 vol %. When the upper layer of the $\alpha$-$Al_2O_3$ layer is formed, the content of HCl gas contained in the raw material gas may be kept at 0.5 to 6 vol %.

Respective contents of gases other than the HCl gas in the raw material gas are 1.3 to 2.5 vol % of $AlCl_3$, 1 to 5 vol % of CO, 0.4 to 3 vol % of $CO_2$, 0.4 to 3 vol % of $H_2S$, and the remainder of $H_2$. Change of the HCl gas content may be compensated for by adjusting the content of $H_2$ gas which is the remainder in the raw material gas. In this way, respective contents of the other gases, and the temperature and the pressure in a furnace of the CVD apparatus can be left unchanged. Further, the temperature in the furnace of the CVD apparatus is 970 to 1020° C. and the pressure in the furnace is 70 to 110 hPa. The surface of the TiCNO layer is oxidized by CO and $CO_2$ contained in the raw material gas.

A description is now given of the change of the HCl gas content when the lower layer in the $\alpha$-$Al_2O_3$ layer is formed. When the lower layer is formed, the content of HCl gas contained in the raw material gas at the start of formation of the lower layer is 6 to 10 vol % as described above, preferably 8 to 10 vol %. The HCl gas content is thereafter decreased to 0.5 to 6 vol % to complete the formation of the lower layer. Preferably, the HCl content is decreased to 0.5 to 4 vol %. The manner in which the HCl gas content is decreased may be continuous decrease with time, or stepwise (multi-stepwise) decrease at certain time intervals, or instantaneous decrease (sharp drop) from 6 to 10 vol % to 0.5 to 6 vol %. Regardless of the manner of changing the HCl gas content, the $\alpha$-$Al_2O_3$ layer having a Cl concentration distribution in which the Cl atomic concentration decreases in the direction away from the base material in the thickness direction of the $\alpha$-$Al_2O_3$ layer can be formed. The time taken for decreasing the HCl gas content from 6 to 10 vol % to 0.5 to 6 vol % may be adjusted appropriately depending on the thickness of the $\alpha$-$Al_2O_3$ layer to be formed and the thickness of the lower layer to be formed.

Conventionally, the content of HCl gas contained in a raw material gas that is to form the α-$Al_2O_3$ layer is on the order of 0.5 to 2 vol % at the start of formation of the α-$Al_2O_3$ layer. This is for the reason that a lower Cl content has been considered preferable for nucleation of α-$Al_2O_3$ crystal grains. The α-$Al_2O_3$ layer formed under this condition, however, is insufficient in adhesion force and has a room for improvement in terms of chipping resistance and fracture resistance. Further, when a portion corresponding to the upper layer in the present embodiment is formed in the conventional α-$Al_2O_3$ layer, the HCl gas content is 5 to 8 vol %, which is higher than the content in the present embodiment. A higher HCl gas content, however, causes a greater number of Cl impurities in α-$Al_2O_3$ crystal grains or grain boundaries, resulting in lower wear resistance.

In the present embodiment, these problems are solved by forming the α-$Al_2O_3$ layer under the above-described conditions, so that the α-$Al_2O_3$ layer includes the lower layer having a concentration distribution in which the Cl atomic concentration decreases in the direction away from the base material, in the thickness direction of the lower layer. Accordingly, an extended life has thus been achieved through the high wear resistance and prevention of coating fracture such as peeling and chipping.

In the present embodiment, it is also preferable to form the α-$Al_2O_3$ layer by changing the HCl gas content as described above, and additionally changing the content of $H_2S$ gas contained in the raw material gas. The manner of changing the $H_2S$ gas content may be the same as the manner of changing the HCl gas content, for example. Specifically, if the HCl gas content is continuously decreased, the $H_2S$ gas content is also continuously decreased. If the HCl gas content is decreased stepwise, the $H_2S$ gas content is also decreased stepwise. Alternatively, when the HCl gas content is instantaneously decreased (sharp drop), the $H_2S$ gas content is also instantaneously decreased. The rate of decrease of the $H_2S$ gas content is smaller than the rate of decrease of the HCl gas content. In the present embodiment, it is also preferable to form the α-$Al_2O_3$ layer while keeping constant the content of $H_2S$ gas contained in the raw material gas. When the α-$Al_2O_3$ layer is formed in this way, the lower layer has respective distributions in which $C_{Cl/S}$ and $C_{Cl/S}$ both decrease in the direction away from the base material, in the thickness direction of the lower layer. Accordingly, the surface-coated cutting tool having high wear resistance and enabling prevention of coating fracture such as peeling and chipping can be manufactured.

EXAMPLES

In the following, the present invention will be described in detail in conjunction with Examples. The present invention, however, is not limited to them.

Example 1

<Preparation of Base Material>
A base material formed of a cemented carbide base material (manufactured by Sumitomo Electric Industries, Ltd.) with a shape of CNMG120408 defined under JIS (Japanese Industrial Standard) B 4120 (2013) was prepared. Prepared base materials were grouped into eight groups named Sample A1 to Sample A8. Each group was made up of four base materials. These base materials had a composition made up of 90.0 wt % of WC, 5.0 wt % of Co, 1.0 wt % of TaC, 2.0 wt % of NbC, and 2.0 wt % of TiC. As described later herein, Samples A1 to A6 are Examples and Samples A7 and A8 are Comparative Examples.

<Formation of Coating>
The base materials of Samples A1 to A8 were set in a CVD apparatus and a coating was formed by the CVD method on the surface of each base material. Conditions for forming each layer other than the α-$Al_2O_3$ layer are indicated in Table 1.

TABLE 1

| | film deposition conditions | | | |
|---|---|---|---|---|
| | composition of raw material gas (vol %) | temperature (° C.) | pressure (hPa) | total gas amount (L/min) |
| TiN | $TiCl_4$ = 2%, $N_2$ = 25%, $H_2$ = remainder | 900 | 200 | 60 |
| TiCN | $TiCl_4$ = 2%, $CH_3CN$ = 0.5%, $N_2$ = 20%, $H_2$ = remainder | 850 | 80 | 95 |
| TiCNO | $TiCl_4$ = 1%, CO = 1%, $CH_4$ = 5%, $N_2$ = 10%, $H_2$ = remainder | 1000 | 250 | 60 |

The coating was formed so that a TiN layer of 0.3 μm, a TiCN layer of 8.0 μm, a TiCNO layer of 0.3 μm, and an α-$Al_2O_3$ layer of 6 μm were deposited in this order on the base material. In Table 2, the layer structure and the thickness (μm) of each layer for each of Samples A1 to A8 are indicated. In Table 2, the thickness (μm) of the upper layer in the α-$Al_2O_3$ layer is also indicated.

TABLE 2

| Sample No. | layer structure and thickness (μm) | upper layer thickness (μm) |
|---|---|---|
| A1 | base material/TiN(0.3)/TiCN(8.0)/TiCNO(0.3)/$Al_2O_3$(6.0) | 5.0 |
| A2 | base material/TiN(0.3)/TiCN(8.0)/TiCNO(0.3)/$Al_2O_3$(6.0) | 5.0 |
| A3 | base material/TiN(0.3)/TiCN(8.0)/TiCNO(0.3)/$Al_2O_3$(6.0) | 5.0 |
| A4 | base material/TiN(0.3)/TiCN(8.0)/TiCNO(0.3)/$Al_2O_3$(6.0) | 5.0 |
| A5 | base material/TiN(0.3)/TiCN(8.0)/TiCNO(0.3)/$Al_2O_3$(6.0) | 5.0 |
| A6 | base material/TiN(0.3)/TiCN(8.0)/TiCNO(0.3)/$Al_2O_3$(6.0) | 5.0 |
| A7 | base material/TiN(0.3)/TiCN(8.0)/TiCNO(0.3)/$Al_2O_3$(6.0) | 5.0 |
| A8 | base material/TiN(0.3)/TiCN(8.0)/TiCNO(0.3)/$Al_2O_3$(6.0) | 5.0 |

In the process of forming the α-$Al_2O_3$ layer, the surface of the TiCNO layer formed on the surface of the TiCN layer by the CVD method was oxidized to cause nucleation of α-$Al_2O_3$ crystal grains, and subsequently the α-$Al_2O_3$ crystal grains were grown. The content of each component of the raw material gas for forming the α-$Al_2O_3$ layer, change of the HCl gas content, and the manner of changing the HCl gas content are indicated in Table 3.

The lower layer of the α-$Al_2O_3$ layer was formed in the following way. For Sample A1, for example, the content of HCl gas contained in the raw material gas was 10 vol % at the start of formation of the lower layer, and the HCl gas content was decreased in three steps (stepwise). Specifically, the HCl gas content was decreased to 8 vol %, 6 vol %, and 4 vol % in this order, and accordingly the formation of the lower layer was completed. Subsequently, the HCl gas content was kept at 4 vol % to form the upper layer. As indicated in Table 3, the $H_2S$ gas content was kept constant in all the steps for forming the α-$Al_2O_3$ layer for Samples A1 to A8.

mum atomic concentration of Cl in each of the lower layer and the upper layer, and the S atomic concentration at each measurement point. Table 5 further indicates, for each of

TABLE 3

| Sample No. | temperature in furnace (° C.) | pressure in furnace (hPa) | $H_2$ (vol %) | CO (vol %) | $CO_2$ (vol %) | $AlCl_3$ (vol %) | $H_2S$ (vol %) | HCl at the start of formation of lower layer (vol %) | HCl at the end of formation of lower layer (vol %) | manner of changing HCl gas during formation of lower layer | HCl during formation of upper layer (vol %) |
|---|---|---|---|---|---|---|---|---|---|---|---|
| A1 | 1000 | 75 | remainder | 2 | 0.5 | 2 | 0.6 | 10 | 4 | stepwise | 4 |
| A2 | 1000 | 75 | remainder | 2 | 0.5 | 2 | 0.6 | 10 | 4 | continuous | 4 |
| A3 | 1000 | 75 | remainder | 2 | 0.5 | 2 | 0.6 | 10 | 4 | sharp drop | 4 |
| A4 | 1000 | 75 | remainder | 2 | 0.5 | 2 | 0.6 | 10 | 6 | stepwise | 6 |
| A5 | 1000 | 75 | remainder | 2 | 0.5 | 2 | 0.6 | 10 | 6 | continuous | 6 |
| A6 | 1000 | 75 | remainder | 2 | 0.5 | 2 | 0.6 | 10 | 6 | sharp drop | 6 |
| A7 | 1000 | 75 | remainder | 2 | 0.5 | 2 | 0.6 | 10 | 10 | flat | 10 |
| A8 | 1000 | 75 | remainder | 1 | 1 | 2 | 0.3 | 10 | 4 | stepwise | 4 |

In the column "manner of changing HCl gas" in Table 3, "stepwise" means that the HCl gas content is decreased stepwise at regular intervals, "continuous" means that the HCl gas content is decreased continuously with time, "sharp drop" means that the HCl gas content is decreased instantaneously from 10 vol % to 4 or 6 vol %, and "flat" means that the HCl gas content is kept constant. In this way, the surface-coated cutting tools of Samples A1 to A8 different from each other in the way of forming the α-$Al_2O_3$ layer (the amount of change of the HCl gas content and the manner of changing the HCl gas content) were produced.

<Test Details>

In Example 1, as described above, four surface-coated cutting tools were produced for each of Samples A1 to A8. For a first tool out of the four tools, the flank face was irradiated with x-ray to measure the TC(006) of the α-$Al_2O_3$ layer by x-ray diffractometry under the above-described conditions. For a second tool, the Cl atomic concentration and the S atomic concentration in the α-$Al_2O_3$ layer were measured by EDS following the above-described measurement method. For a third tool, the wear resistance was evaluated. For a fourth tool, the fracture resistance was evaluated.

In particular, the Cl atomic concentration and the S atomic concentration in the lower layer of the α-$Al_2O_3$ layer were measured at regular intervals in the thickness direction of the lower layer. Specifically, the lower layer had a thickness of 1.0 μm from the interface with the TiCNO layer which was adjacent to the lower layer and located between the lower layer and the base material. In a cross section of the coating, measurement points (first to fifth measurement points) were therefore defined at 0.2 μm intervals from the point abutting on the interface with the TiCNO layer which was adjacent to the lower layer and located between the lower layer and the base material. Then, the Cl atomic concentration and the S atomic concentration in the lower layer were calculated (see FIG. 1). Further, based on the calculated Cl atomic concentration and S atomic concentration, sum $C_{Cl/S}$ of the chlorine atomic concentration at these measurement points and the sulfur atomic concentration at these measurement points, as well as quotient $C_{Cl/S}$ determined by dividing the chlorine atomic concentration at the measurement points by the sulfur atomic concentration at the measurement points were also calculated.

The wear resistance and the fracture resistance were evaluated in the following way. Table 4 indicates, for each of Samples A1 to A8, TC (006) of the α-$Al_2O_3$ layer, the Cl atomic concentration at each measurement point, the maxi- Samples A1 to A8, the sum $C_{Cl/S}$ and the quotient $C_{Cl/S}$ at each measurement point as well as the results of evaluation of the wear resistance and the fracture resistance together with performance rank.

<Evaluation of Wear Resistance>
Workpiece: SUJ2
Cutting Speed: 300 m/min
Feed: 0.3 mm/rev
Depth of Cut: 1.5 mm
Cutting Oil: wet
Evaluation: The time taken for the maximum width of an exposed portion of the base material to exceed 0.1 mm was evaluated.

Specifically, for evaluation of the wear resistance, the above-described surface-coated cutting tools were each set on an NC lathe, and the time elapsed from the start of cutting of the above-indicated workpiece to the time when the maximum width of an exposed portion of the base material exceeded 0.1 mm due to wear for example of the tool surface during cutting, was evaluated. As this time is longer, the wear resistance can be evaluated as higher wear resistance.

<Evaluation of Fracture Resistance>
Workpiece: SCM435, grooved material
Cutting Speed: 150 m/min
Feed: 0.2 mm/rev
Depth of Cut: 1.5 mm
Cutting Oil: wet
Evaluation: The state of chipping after the workpiece was cut for five minutes was compared by visual inspection. If it became impossible to continue cutting before the elapse of five minutes, due to chipping or fracture, the actually elapsed time was evaluated.

Specifically, for evaluation of the fracture resistance, the above-described surface-coated cutting tools were each set on an NC lathe, the workpiece was cut for five minutes under the above-described conditions, and the state of chipping at this time was compared by visual inspection. If it became impossible to continue cutting before the elapse of five minutes due to chipping or fracture, the time elapsed to this time was evaluated. If the state of chipping after the workpiece was cut for five minutes was still wear (normal wear) and substantially no chipping or fracture was identified, the fracture resistance can be evaluated as high fracture resistance. As the time elapsed to occurrence of chipping or fracture is longer, the fracture resistance can be evaluated as higher fracture resistance.

TABLE 4

| Sample No. | XRD results TC(006) | Cl concentration (at. %) | | | | | | | | S concentration (at. %) | | | | |
|---|---|---|---|---|---|---|---|---|---|---|---|---|---|---|
| | | 1st measurement point | 2nd measurement point | 3rd measurement point | 4th measurement point | 5th measurement point | max in lower layer ($C_{ClMAX-1}$) | max in upper layer ($2C_{ClMAX-2}$) | $C_{ClMAX-1} \geq 2C_{ClMAX-2}$ | 1st measurement point | 2nd measurement point | 3rd measurement point | 4th measurement point | 5th measurement point |
| A1 | 5.56 | 0.161 | 0.151 | 0.113 | 0.08 | 0.022 | 0.161 | 0.024 | YES | 0.006 | 0.006 | 0.005 | 0.006 | 0.005 |
| A2 | 6.11 | 0.181 | 0.144 | 0.107 | 0.066 | 0.031 | 0.181 | 0.035 | YES | 0.006 | 0.005 | 0.006 | 0.006 | 0.005 |
| A3 | 5.88 | 0.175 | 0.17 | 0.168 | 0.112 | 0.043 | 0.175 | 0.043 | YES | 0.005 | 0.006 | 0.006 | 0.005 | 0.004 |
| A4 | 5.42 | 0.163 | 0.148 | 0.131 | 0.108 | 0.091 | 0.163 | 0.095 | NO | 0.005 | 0.005 | 0.005 | 0.006 | 0.006 |
| A5 | 5.73 | 0.157 | 0.151 | 0.125 | 0.113 | 0.101 | 0.157 | 0.111 | NO | 0.005 | 0.006 | 0.006 | 0.006 | 0.006 |
| A6 | 6.01 | 0.161 | 0.158 | 0.152 | 0.111 | 0.099 | 0.161 | 0.107 | NO | 0.006 | 0.006 | 0.005 | 0.005 | 0.006 |
| A7 | 5.83 | 0.169 | 0.172 | 0.171 | 0.162 | 0.169 | 0.172 | 0.177 | NO | 0.005 | 0.005 | 0.006 | 0.005 | 0.006 |
| A8 | 3.88 | 0.172 | 0.151 | 0.101 | 0.081 | 0.049 | 0.172 | 0.049 | YES | 0.006 | 0.006 | 0.005 | 0.005 | 0.006 |

TABLE 5

| Sample No. | $C_{Cl/S}$ | | | | | $C_{Cl/S}$ | | | | | cutting performance | | |
|---|---|---|---|---|---|---|---|---|---|---|---|---|---|
| | 1st measurement point | 2nd measurement point | 3rd measurement point | 4th measurement point | 5th measurement point | 1st measurement point | 2nd measurement point | 3rd measurement point | 4th measurement point | 5th measurement point | wear resistance time (min) | state of fracture resistance time (min) | performance rank |
| A1 | 0.167 | 0.157 | 0.118 | 0.086 | 0.027 | 26.83 | 25.17 | 22.6 | 13.33 | 4.4 | 17.1 | normal wear | A |
| A2 | 0.187 | 0.149 | 0.113 | 0.072 | 0.036 | 30.17 | 28.8 | 17.83 | 11 | 6.2 | 17.9 | normal wear | A |
| A3 | 0.18 | 0.176 | 0.174 | 0.117 | 0.047 | 35 | 28.33 | 28 | 22.4 | 10.75 | 16.8 | normal wear | A |
| A4 | 0.168 | 0.153 | 0.136 | 0.114 | 0.097 | 32.6 | 29.6 | 26.2 | 18 | 15.17 | 13.0 | irregular wear | B |
| A5 | 0.162 | 0.157 | 0.131 | 0.119 | 0.107 | 31.4 | 25.17 | 20.83 | 18.83 | 16.83 | 13.5 | irregular wear | B |
| A6 | 0.167 | 0.164 | 0.157 | 0.116 | 0.105 | 26.83 | 26.33 | 30.4 | 22.2 | 16.5 | 13.9 | irregular wear | B |
| A7 | 0.174 | 0.177 | 0.177 | 0.167 | 0.175 | 33.8 | 34.4 | 28.5 | 32.4 | 28.17 | 12.3 | chipping | C |
| A8 | 0.178 | 0.157 | 0.106 | 0.086 | 0.055 | 28.67 | 25.17 | 20.2 | 16.2 | 8.17 | 7.1 | chipping | C |

In Table 5, performance ranks represented by symbols such as symbol A are defined as follows.

A: very high in wear resistance and fracture resistance (the time (min) taken for the maximum width of a base material's exposed portion to exceed 0.1 mm is more than 15 minutes and the state of fracture resistance is normal wear)

B: high in wear resistance and fracture resistance (the time (min) taken for the maximum width of a base material's exposed portion to exceed 0.1 mm is more than 10 minutes but not more than 15 minutes, and the state of fracture resistance is normal wear or irregular wear due to minute chipping)

C: insufficient in wear resistance or fracture resistance (at least the time (min) taken for the maximum width of a base material's exposed portion to exceed 0.1 mm is 10 minutes or less, or the state of fracture resistance is chipping or fracture (including the state where it is impossible to continue cutting and the elapsed time is indicated)

<Results of Evaluation>

As seen from Tables 4 and 5, the Examples corresponding to Samples A1 to A6 could be evaluated as exhibiting higher wear resistance and fracture resistance than the Comparative Examples corresponding to Samples A7 and A8. Specifically, the surface-coated cutting tools of Samples A1 to A6 have a chlorine concentration distribution in which the chlorine atomic concentration in the lower layer of the $\alpha$-$Al_2O_3$ layer decreases in the direction away from the base material, in the thickness direction of the lower layer, and these surface-coated cutting tools are identified as having high wear resistance and enabling prevention of coating fracture such as peeling and chipping to thereby achieve an extended life.

In particular, Samples A1 to A3 at least satisfy any of the conditions: the maximum atomic concentration of chlorine in the lower layer is less than 0.3 at. %; the maximum atomic concentration of chlorine in the upper layer is less than 0.05 at. %; and the relation $C_{ClMAX-1} \geq 2C_{ClMAX-2}$ is met, where $C_{ClMAX-1}$ represents a maximum atomic concentration of chlorine in the lower layer and $C_{ClMAX-2}$ represents a maximum atomic concentration of chlorine in the upper layer, and these Samples A1 to A3 are still higher in wear resistance and fracture resistance. Samples A1 to A6 all had a $C_{Cl/S}$ distribution in which $C_{Cl/S}$ in the lower layer decreases in the direction away from the base material, in the thickness direction of the lower layer, as well as a $C_{Cl/S}$ distribution in which $C_{Cl/S}$ in the lower layer decreases in the direction away from the base material, in the thickness direction of the lower layer.

Example 2

<Preparation of Base Material>

A base material formed of a cemented carbide base material (manufactured by Sumitomo Electric Industries, Ltd.) with the same shape (CNMG120408) as Example 1 was prepared. Prepared base materials were grouped into eight groups named Sample B1 to Sample B8. Each group was made up of four base materials. As described later herein, Samples B1 to B6 are Examples and Samples B7 and B8 are Comparative Examples.

<Formation of Coating>

The base materials of Samples B1 to B8 were set in a CVD apparatus and a coating was formed by the CVD method on the surface of each base material, under the same conditions as Example 1, except for the conditions for the $\alpha$-$Al_2O_3$ layer (see Table 1).

The coating was formed so that a TiN layer of 0.3 μm, a TiCN layer of 8.0 μm, a TiCNO layer of 0.3 μm, and an $\alpha$-$Al_2O_3$ layer of 10 μm were deposited in this order on the base material. In Table 6, the layer structure and the thickness (μm) of each layer for each of Samples B1 to B8 are indicated. In Table 6, the thickness (μm) of the upper layer in the $\alpha$-$Al_2O_3$ layer is also indicated.

TABLE 6

| Sample No. | layer structure and thickness (μm) | upper layer thickness (μm) |
|---|---|---|
| B1 | base material/TiN(0.3)/TiCN(8.0)/TiCNO(0.3)/$Al_2O_3$(10) | 9.0 |
| B2 | base material/TiN(0.3)/TiCN(8.0)/TiCNO(0.3)/$Al_2O_3$(10) | 9.0 |
| B3 | base material/TiN(0.3)/TiCN(8.0)/TiCNO(0.3)/$Al_2O_3$(10) | 9.0 |
| B4 | base material/TiN(0.3)/TiCN(8.0)/TiCNO(0.3)/$Al_2O_3$(10) | 9.0 |
| B5 | base material/TiN(0.3)/TiCN(8.0)/TiCNO(0.3)/$Al_2O_3$(10) | 9.0 |
| B6 | base material/TiN(0.3)/TiCN(8.0)/TiCNO(0.3)/$Al_2O_3$(10) | 9.0 |
| B7 | base material/TiN(0.3)/TiCN(8.0)/TiCNO(0.3)/$Al_2O_3$(10) | 9.0 |
| B8 | base material/TiN(0.3)/TiCN(8.0)/TiCNO(0.3)/$Al_2O_3$10) | 9.0 |

In the process of forming the $\alpha$-$Al_2O_3$ layer, the surface of the TiCNO layer formed on the surface of the TiCN layer by the CVD method was oxidized to cause nucleation of $\alpha$-$Al_2O_3$ crystal grains, and subsequently the $\alpha$-$Al_2O_3$ crystal grains were grown. The content of each component of the raw material gas for forming the $\alpha$-$Al_2O_3$ layer, change of the HCl gas content, and the manner of changing the HCl gas content are indicated in Table 7.

In particular, Example 2 includes an example where the HCl gas content was changed as described above and further the $H_2S$ gas content contained in the raw material gas was changed. The change of the $H_2S$ gas content is indicated in Table 7.

The lower layer of the $\alpha$-$Al_2O_3$ layer was formed in the following way. For Sample B1, for example, the content of HCl gas contained in the raw material gas was 10 vol % at the start of formation of the lower layer, and the HCl gas content was decreased in three steps (stepwise). Specifically, the HCl gas content was decreased to 8 vol %, 6 vol %, and 4 vol % in this order, and accordingly the formation of the lower layer was completed. The content of $H_2S$ gas contained in the raw material gas was 1 vol % at the start of formation of the lower layer, and the $H_2S$ gas content was decreased in three steps (stepwise). Specifically, the $H_2S$ gas content was decreased to 0.8 vol %, 0.7 vol %, and 0.5 vol % in this order, and accordingly the formation of the lower layer was completed. Subsequently, the HCl gas content was kept at 4 vol % and the $H_2S$ gas content was kept at 0.5 vol % to form the upper layer.

As to Sample B2, in the process of forming the lower layer, the content of HCl gas contained in the raw material gas was decreased in three steps (stepwise) like Sample B1, while the content of $H_2S$ gas contained in the raw material gas was kept at 0.6 vol %. Further, as to Sample B3, for example, in the process of forming the lower layer, the content of HCl gas contained in the raw material gas was decreased in three steps (stepwise) like Sample B1, while the content of $H_2S$ gas contained in the raw material gas was 0.5% at the start of formation, and the content was increased in three steps (stepwise). Specifically, the $H_2S$ gas content was increased to 0.7 vol %, 0.8 vol %, and 1 vol % in this order, and accordingly the formation of the lower layer was completed.

TABLE 7

| Sample No. | temperature in furnace (° C.) | pressure in furnace (hPa) | $H_2$ (vol %) | CO (vol %) | $CO_2$ (vol %) | $AlCl_3$ (vol %) | HCl at the start of formation of lower layer (vol %) | HCl at the end of formation of lower layer (vol %) | manner of changing HCl gas during formation of lower layer | HCl during formation of upper layer (vol %) | $H_2S$ at the start of formation of lower layer (vol %) | $H_2S$ at the end of formation of lower layer (vol %) |
|---|---|---|---|---|---|---|---|---|---|---|---|---|
| B1 | 1000 | 75 | remainder | 2 | 0.5 | 2 | 10 | 4 | stepwise | 4 | 1.0 | 0.5 |
| B2 | 1000 | 75 | remainder | 2 | 0.5 | 2 | 10 | 4 | stepwise | 4 | 0.6 | 0.6 |
| B3 | 1000 | 75 | remainder | 2 | 0.5 | 2 | 10 | 4 | stepwise | 4 | 0.5 | 1.0 |
| B4 | 1000 | 75 | remainder | 2 | 0.5 | 2 | 10 | 6 | stepwise | 6 | 1.0 | 0.5 |
| B5 | 1000 | 75 | remainder | 2 | 0.5 | 2 | 10 | 6 | stepwise | 6 | 0.6 | 0.6 |
| B6 | 1000 | 75 | remainder | 2 | 0.5 | 2 | 10 | 6 | stepwise | 6 | 0.5 | 1.0 |
| B7 | 1000 | 75 | remainder | 2 | 0.5 | 2 | 10 | 10 | flat | 10 | 0.6 | 0.6 |
| B8 | 1000 | 75 | remainder | 1 | 1 | 2 | 10 | 4 | stepwise | 4 | 0.6 | 0.6 |

In the column "manner of changing HCl gas" in Table 7, the meanings of the terms "stepwise," "continuous" and "sharp drop" are identical to those in Table 3. In this way, the surface-coated cutting tools of Samples B1 to B8 different from each other in the way of forming the α-Al$_2$O$_3$ layer (the amount of change of the HCl gas content and the manner of changing the HCl gas content, as well as the amount of change of the H$_2$S gas content) were produced.

<Test Details>

In Example 2, as described above, four surface-coated cutting tools were produced for each of Samples B1 to B8. For a first tool out of the four tools, the flank face was irradiated with x-ray to measure the TC(006) of the α-Al$_2$O$_3$ layer by x-ray diffractometry under the above-described conditions. For a second tool, the Cl atomic concentration and the S atomic concentration in the α-Al$_2$O$_3$ layer were measured by EDS following the above-described measurement method. For a third tool, the wear resistance was evaluated. For a fourth tool, the fracture resistance was evaluated.

In particular, the Cl atomic concentration and the S atomic concentration in the lower layer of the α-Al$_2$O$_3$ layer were measured at regular intervals in the thickness direction of the lower layer. Specifically, the lower layer had a thickness of 1.0 μm from the interface with the TiCNO layer which was adjacent to the lower layer and located between the lower layer and the base material. In a cross section of the coating, measurement points (first to fifth measurement points) were therefore defined at 0.2 μm intervals from the point abutting on the interface with the TiCNO layer which was adjacent to the lower layer and located between the lower layer and the base material. Then, the Cl atomic concentration and the S atomic concentration in the lower layer were calculated (see FIG. 1). Further, based on the calculated Cl atomic concentration and S atomic concentration, sum $C_{Cl/S}$ of the chlorine atomic concentration at these measurement points and the sulfur atomic concentration at these measurement points, as well as quotient $C_{Cl/S}$ determined by dividing the chlorine atomic concentration at the measurement points by the sulfur atomic concentration at the measurement points were also calculated.

The wear resistance, the fracture resistance, and the performance rank were evaluated in the same manner as Example 1. Table 8 indicates, for each of Samples B1 to B8, the TC (006) of the α-Al$_2$O$_3$ layer, the Cl atomic concentration at each measurement point, the maximum atomic concentration of Cl in each of the lower layer and the upper layer, and the S atomic concentration at each measurement point. Table 9 further indicates, for each of Samples B1 to B8, the sum $C_{ClS}$ and the quotient $C_{Cl/S}$ at each measurement point as well as the results of evaluation of the wear resistance and the fracture resistance together with performance rank.

TABLE 8

| Sample No. | XRD results TC(006) | Cl concentration (at. %) | | | | | | | | S concentration (at. %) | | | | |
|---|---|---|---|---|---|---|---|---|---|---|---|---|---|---|
| | | 1st measurement point | 2nd measurement point | 3rd measurement point | 4th measurement point | 5th measurement point | max in lower layer ($C_{ClMAX-1}$) | max in upper layer ($2C_{ClMAX-2}$) | $C_{ClMAX-1} \geq 2C_{ClMAX-2}$ | 1st measurement point | 2nd measurement point | 3rd measurement point | 4th measurement point | 5th measurement point |
| B1 | 5.77 | 0.167 | 0.147 | 0.129 | 0.101 | 0.052 | 0.167 | 0.054 | YES | 0.011 | 0.009 | 0.007 | 0.005 | 0.004 |
| B2 | 6.07 | 0.178 | 0.151 | 0.113 | 0.092 | 0.048 | 0.178 | 0.05 | YES | 0.006 | 0.005 | 0.006 | 0.005 | 0.006 |
| B3 | 5.93 | 0.155 | 0.129 | 0.105 | 0.072 | 0.038 | 0.155 | 0.044 | YES | 0.003 | 0.005 | 0.007 | 0.009 | 0.01 |
| B4 | 5.66 | 0.18 | 0.171 | 0.152 | 0.127 | 0.112 | 0.18 | 0.112 | NO | 0.011 | 0.01 | 0.008 | 0.006 | 0.004 |
| B5 | 5.99 | 0.177 | 0.151 | 0.144 | 0.125 | 0.095 | 0.177 | 0.101 | NO | 0.005 | 0.006 | 0.006 | 0.006 | 0.005 |
| B6 | 6.12 | 0.168 | 0.147 | 0.131 | 0.106 | 0.089 | 0.168 | 0.098 | NO | 0.004 | 0.006 | 0.007 | 0.009 | 0.011 |
| B7 | 5.72 | 0.162 | 0.155 | 0.159 | 0.165 | 0.163 | 0.165 | 0.170 | NO | 0.006 | 0.006 | 0.005 | 0.005 | 0.006 |
| B8 | 4.01 | 0.166 | 0.133 | 0.105 | 0.084 | 0.041 | 0.166 | 0.044 | YES | 0.005 | 0.005 | 0.006 | 0.005 | 0.006 |

TABLE 9

| Sample No. | $C_{ClS}$ | | | | | $C_{Cl/S}$ | | | | | cutting performance | | |
|---|---|---|---|---|---|---|---|---|---|---|---|---|---|
| | 1st measurement point | 2nd measurement point | 3rd measurement point | 4th measurement point | 5th measurement point | 1st measurement point | 2nd measurement point | 3rd measurement point | 4th measurement point | 5th measurement point | wear resistance time (min) | state of fracture resistance time (min) | performance rank |
| B1 | 0.178 | 0.156 | 0.136 | 0.106 | 0.055 | 15.18 | 16.33 | 18.43 | 20.2 | 17.33 | 17.3 | irregular wear | B |
| B2 | 0.184 | 0.156 | 0.119 | 0.097 | 0.054 | 29.67 | 30.2 | 18.83 | 18.4 | 8 | 20.5 | normal wear | A |
| B3 | 0.158 | 0.134 | 0.112 | 0.081 | 0.048 | 51.67 | 25.8 | 15 | 8 | 3.8 | 21.4 | normal wear | A |
| B4 | 0.191 | 0.181 | 0.16 | 0.133 | 0.116 | 16.36 | 17.1 | 19 | 21.17 | 28 | 13.9 | irregular wear | B |
| B5 | 0.182 | 0.157 | 0.15 | 0.131 | 0.1 | 35.4 | 25.17 | 24 | 20.83 | 19 | 15.2 | irregular wear | B |
| B6 | 0.172 | 0.153 | 0.138 | 0.115 | 0.1 | 42 | 24.5 | 18.71 | 11.78 | 8.09 | 14.7 | irregular wear | B |
| B7 | 0.168 | 0.161 | 0.164 | 0.17 | 0.169 | 27 | 25.83 | 31.8 | 33 | 27.17 | 14.3 | 3.3 | C |
| B8 | 0.171 | 0.138 | 0.111 | 0.089 | 0.047 | 33.2 | 26.6 | 17.5 | 16.8 | 6.83 | 9.1 | 3.0 | C |

<Results of Evaluation>

As seen from Tables 8 and 9, the Examples corresponding to Samples B1 to B6 could be evaluated as exhibiting higher wear resistance and fracture resistance than the Comparative Examples corresponding to Samples B7 and B8. Specifically, the surface-coated cutting tools of Samples B1 to B6 have a chlorine concentration distribution in which the chlorine atomic concentration in the lower layer of the α-Al$_2$O$_3$ layer decreases in the direction away from the base material, in the thickness direction of the lower layer, and these surface-coated cutting tools are identified as having high wear resistance and enabling prevention of coating fracture such as peeling and chipping to thereby achieve an extended life.

In particular, Samples B1, B2, and B3 at least satisfy any of the conditions: the maximum atomic concentration of chlorine in the lower layer is less than 0.3 at. %; the maximum atomic concentration of chlorine in the upper layer is less than 0.05 at. %; and the relation $C_{ClMAX-1} > 2C_{ClMAX-2}$ is met, where $C_{ClMAX-1}$ represents a maximum atomic concentration of chlorine in the lower layer and $C_{ClMAX-2}$ represents a maximum atomic concentration of chlorine in the upper layer, and these Samples B1, B2, and B3 are still higher in wear resistance and fracture resistance.

Further, Samples B1 and B2 have a distribution in which $C_{ClS}$ decreases in the direction away from the base material, in the thickness direction of the α-Al$_2$O$_3$ layer, and also have a distribution in which $C_{ClS}$ decreases in the direction away from the base material, in the thickness direction of the α-Al$_2$O$_3$ layer. It is seen that these Samples B2 and B3 are still higher in wear resistance and fracture resistance than Sample B1.

As is apparent from Tables 4, 5, 8, and 9, the surface-coated cutting tools in the Examples are high in wear resistance and fracture resistance. Accordingly, each Example is identified as being superior to each of the Comparative Examples and achieving an extended life.

While the embodiment and examples of the present invention have been described above, it is originally intended that the above-described features of the embodiment and examples may be combined as appropriate or modified in various manners.

It should be construed that the embodiment disclosed herein is given by way of example in all respects, not by way of limitation. It is intended that the scope of the present invention is defined by claims, not by the above-described embodiment, and encompasses all modifications equivalent in meaning and scope to the claims.

REFERENCE SIGNS LIST

1 α-Al$_2$O$_3$ layer; 2 TiCN layer; 3 TiCNO layer; 4 measurement point; 41 first measurement point; 42 second measurement point; 43 third measurement point; 44 fourth measurement point; 45 fifth measurement point

The invention claimed is:

1. A surface-coated cutting tool comprising a base material and a coating formed on the base material,
the coating including an α-Al$_2$O$_3$ layer,
the α-Al$_2$O$_3$ layer containing a plurality of α-Al$_2$O$_3$ crystal grains and chlorine, and having a TC(006) of more than 5 in texture coefficient TC(hkl),
the α-Al$_2$O$_3$ layer including a lower layer and an upper layer, the lower layer being located closer to the base material than the upper layer is, and the upper layer being located opposite to the base material across the lower layer, in a thickness direction of the α-Al$_2$O$_3$ layer,
the lower layer having a thickness of 1.0 μm,
the upper layer having a thickness of 0.5 μm or more,
the chlorine in the lower layer having a concentration distribution in which an atomic concentration of the chlorine decreases in a direction away from the base material, in a thickness direction of the lower layer.

2. The surface-coated cutting tool according to claim 1, wherein the chlorine in the lower layer has a maximum atomic concentration of less than 0.3 at. %.

3. The surface-coated cutting tool according to claim 1, wherein the chlorine in the upper layer has a maximum atomic concentration of less than 0.05 at. %.

4. The surface-coated cutting tool according to claim 1, wherein
the surface-coated cutting tool satisfies a relation: $C_{ClMAX-1} \geq 2C_{ClMAX-2}$, where $C_{ClMAX-1}$ represents a maximum atomic concentration of the chlorine in the lower layer and $C_{ClMAX-2}$ represents a maximum atomic concentration of the chlorine in the upper layer.

5. The surface-coated cutting tool according to claim 1, wherein
the TC(006) is more than 6.

6. The surface-coated cutting tool according to claim 1, wherein
the lower layer contains sulfur, and
the lower layer has a $C_{cls}$ distribution in which $C_{cls}$ decreases in the direction away from the base material, in the thickness direction of the lower layer, where $C_{cls}$ represents a numerical value determined by adding together an atomic concentration of the chlorine at a predetermined measurement point in the lower layer and an atomic concentration of the sulfur at the predetermined measurement point.

7. The surface-coated cutting tool according to claim 1, wherein
the lower layer contains sulfur, and
the lower layer has a $C_{cl/s}$ distribution in which $C_{cl/s}$ decreases in the direction away from the base material, in the thickness direction of the lower layer, where $C_{cl/s}$ represents a numerical value determined by dividing an atomic concentration of the chlorine at a predetermined measurement point in the lower layer by an atomic concentration of the sulfur at the predetermined measurement point.

8. A method of manufacturing a surface-coated cutting tool as recited in claim 1, the method comprising a step of forming, on the base material by a CVD method, the coating including the α-Al$_2$O$_3$ layer,
in the step, a content of HCl gas contained in a raw material gas being 6 to 10 vol % at a start of formation of the α-Al$_2$O$_3$ layer, and the content of HCl gas being decreased to 0.5 to 6 vol % after the start of formation.

* * * * *